(12) United States Patent
Murata et al.

(10) Patent No.: US 9,287,847 B2
(45) Date of Patent: Mar. 15, 2016

(54) MODULE

(71) Applicant: TAIYO YUDEN CO., LTD., Tokyo (JP)

(72) Inventors: Ryuji Murata, Kanagawa (JP); Nobuaki Matsuo, Kanagawa (JP); Yuki Matsubayashi, Kanagawa (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 48 days.

(21) Appl. No.: 14/150,290

(22) Filed: Jan. 8, 2014

(65) Prior Publication Data

US 2014/0203887 A1    Jul. 24, 2014

(30) Foreign Application Priority Data

Jan. 21, 2013   (JP) .................. 2013-008343

(51) Int. Cl.
*H01P 1/10*      (2006.01)
*H04B 1/44*      (2006.01)
*H03H 7/46*      (2006.01)
*H03H 7/38*      (2006.01)
*H04B 1/52*      (2015.01)

(52) U.S. Cl.
CPC ............... *H03H 7/465* (2013.01); *H03H 7/38* (2013.01); *H03H 2007/386* (2013.01); *H04B 1/52* (2013.01)

(58) Field of Classification Search
CPC ............... H01P 1/15; H04B 1/44; H04B 1/48
USPC ............... 333/101, 103, 124, 126; 455/73, 78
See application file for complete search history.

(56) References Cited

U.S. PATENT DOCUMENTS

| 7,049,906 | B2 * | 5/2006 | Wilcox | 333/126 |
| 2005/0245202 | A1 * | 11/2005 | Ranta et al. | 455/78 |
| 2008/0186106 | A1 * | 8/2008 | Christian et al. | 333/133 |
| 2010/0135193 | A1 * | 6/2010 | Przadka | 370/297 |
| 2010/0189031 | A1 * | 7/2010 | Kanou | 370/328 |
| 2011/0181342 | A1 | 7/2011 | Uejima et al. | |

FOREIGN PATENT DOCUMENTS

JP    2008-48450 A    2/2008
WO   2010/024376 A1  3/2010

* cited by examiner

*Primary Examiner* — Dean Takaoka
(74) *Attorney, Agent, or Firm* — Chen Yoshimura LLP

(57) ABSTRACT

A module includes: a diplexer that includes a first terminal, a second terminal, and a common terminal coupled to an antenna; a first switch that is coupled to the first terminal, includes first ports, and selects, from the first ports, and connects one port to the diplexer; a first duplexer that is coupled to at least one of the first ports; a second duplexer that is coupled to the second terminal and has a passband different from a passband of the first duplexer; and a first impedance portion that is coupled to another port of the first ports.

11 Claims, 7 Drawing Sheets

MODULE

CROSS-REFERENCE TO RELATED APPLICATION

This application is based upon and claims the benefit of priority of the prior Japanese Patent Application No. 2013-008343, filed on Jan. 21, 2013, the entire contents of which are incorporated herein by reference.

FIELD

A certain aspect of the present invention relates to a module.

BACKGROUND

Communication devices such as mobile phones have widened their functions including connection to the Internet. To address the increase of communication data, development of technologies such as LTE (Long Term Evolution)-Advanced has been promoted. In the LTE-Advanced system, CA (Carrier Aggregation) is used to obtain high throughput. For example, Inter Band Non Contiguous CA is a technique to widen the band, increase the speed, and increase an amount of data by sharing two or more frequency bands such as an 800 MHz band and a 2 GHz band. For example, two signals such as a video and a sound or a sound and data can be simultaneously transmitted and received. Or, two signals may be simultaneously transmitted only, or simultaneously received only.

To support two or more frequency bands, used are duplexers with different passbands and a switch that switches the duplexers. This enables to support communication methods of two or more countries and areas. For example, International Publication No. 2010/024376 discloses a technique that connects a resistance to a port of a switch using an FET (Field Effect Transistor). Japanese Patent Application Publication No. 2008-48450 discloses a module to which a switch and a diplexer are connected. Duplexers are connected to a diplexer through the switch. Thus, signals of different communication methods can be transmitted and received.

For example, when signals of two communication systems are simultaneously transmitted and received, two duplexers are coupled to the diplexer. Good frequency characteristics can be obtained by impedance matching. When a first signal of the two signals is transmitted and received, one duplexer is coupled to the diplexer. At this time, to block a second signal, the switch is turned off. The switch in an off state has, for example, an open impedance. Or, a first end of the switch is grounded to enhance a switch off state. In such cases, the impedance deviates from, for example, 50Ω, and thus it is difficult to match the impedance of the diplexer having a port of which the impedance is designed to be 50Ω, and the insertion loss may increase.

SUMMARY OF THE INVENTION

According to an aspect of the present invention, there is provided a module including: a diplexer that includes a first terminal, a second terminal, and a common terminal coupled to an antenna; a first switch that is coupled to the first terminal, includes first ports, and selects, from the first ports, and connects one port to the diplexer; a first duplexer that is coupled to at least one of the first ports; a second duplexer that is coupled to the second terminal and has a passband different from a passband of the first duplexer; and a first impedance portion that is coupled to another port of the first ports.

DETAILED DESCRIPTION

A description will be given of embodiments with reference to the drawings.

First Embodiment

Figure 1:
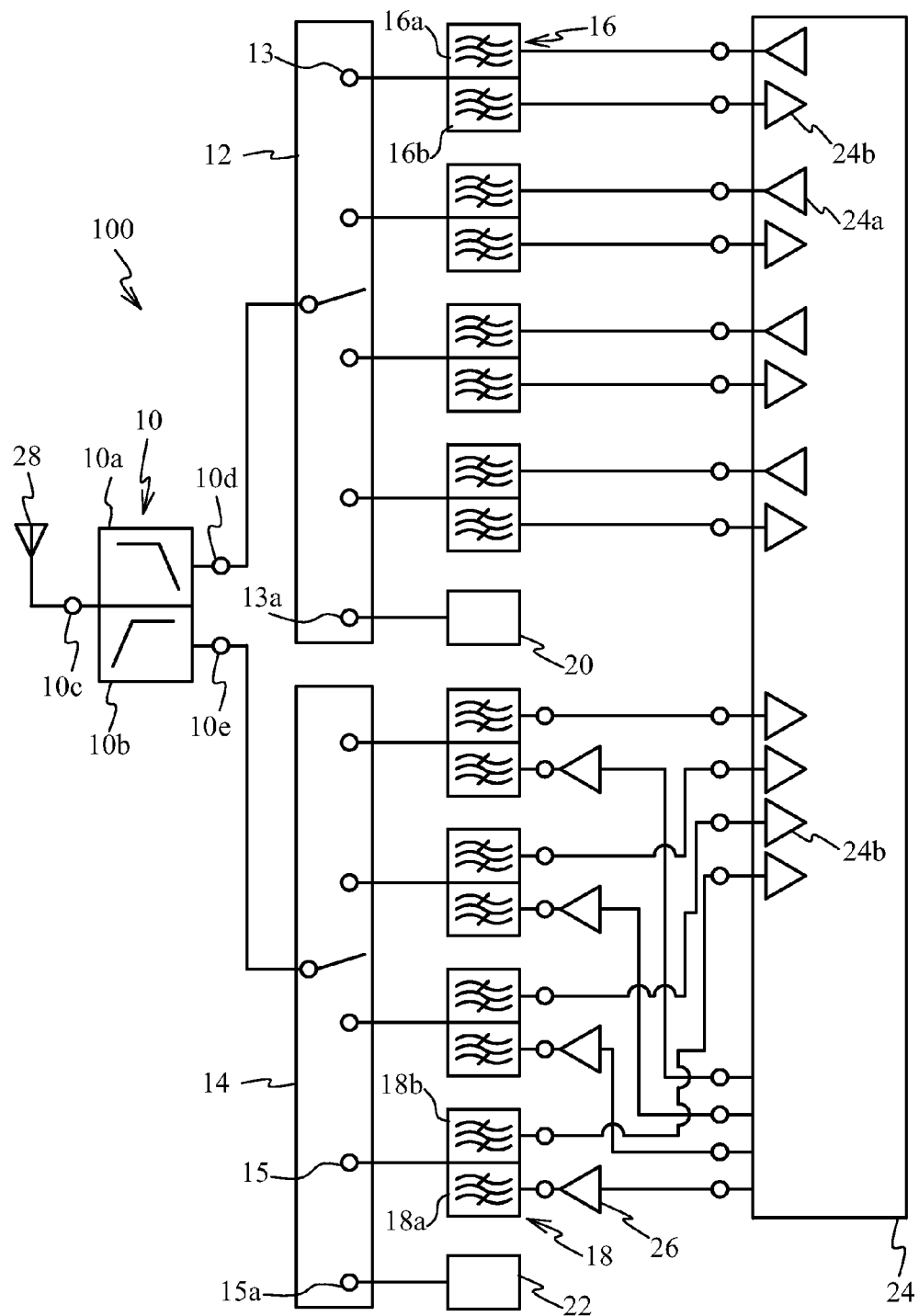
FIG. 1 is a circuit diagram illustrating a module in accordance with a first embodiment.

A first embodiment connects an impedance portion to a port. FIG. 1 is a circuit diagram illustrating a module 100 in accordance with the first embodiment.

As illustrated in FIG. 1, the module 100 includes a diplexer 10, switches 12 and 14, duplexers 16 and 18, impedance portions 20 and 22, an integrated circuit (IC) 24, and power amplifiers (PA) 26.

The diplexer 10 includes a low-pass filter (LPF) 10a and a high-pass filter (HPF) 10b. The switch 12 includes five ports 13. The switch 14 includes five ports 15. The duplexer 16 includes a transmit filter 16a and a receive filter 16b. The duplexer 18 includes a transmit filter 18a and a receive filter 18b. The filter included in the duplexer is, for example, a bandpass filter. The IC 24 includes PAs 24a and low noise amplifiers (LNA) 24b.

First ends of the LPF 10a and the HPF 10b are commonly connected to an antenna 28 through an antenna terminal 10c. A second end of the LPF 10a is coupled to a first end of the switch 12 through a terminal 10d. A second end of the HPF 10b is coupled to a first end of the switch 14 through a terminal 10e.

First ends of the duplexers 16 are coupled to four ports 13 of the five ports 13 of the switch 12. A first end of the impedance portion 20 is coupled to a port 13a of the five ports 13. The switch 12 selects, from the ports 13, and connects one port to the diplexer 10. The transmit filter 16a is coupled to the PA 24a. The receive filter 16b is coupled to the LNA 24b.

First ends of the duplexers 18 are coupled to four ports 15 of the switch 14. A first end of the impedance portion 22 is coupled to a port 15a of the five ports 15. The switch 14 selects, from the ports 15, and connects one port to the diplexer 10. The transmit filter 18a is coupled to the PA 26. The receive filter 18b is coupled to the LNA 24b. Each of the impedance portions 20 and 22 has an impedance of 50Ω.

The frequency of the passband of the duplexer 16 is lower than the frequency of the passband of the duplexer 18. The frequency of the passband of the transmit filter 16a differs from the frequency of the passband of the receive filter 16b. The four duplexers 16 have different passbands. The four duplexers 18 have different passbands. The IC 24 performs a signal processing such as up-converting and down-converting. The PAs 24a and 26, and the LNAs 24b amplify signals.

The antenna 28 transmits and receives an RF signal. The diplexer 10 outputs a signal to one of the switches 12 and 14 in accordance with the frequency, and does not output it to the other one. In addition, the diplexer 10 outputs a signal input from one of the switches 12 and 14 to the antenna 28, and does not output a signal from the other one. A signal transmitted through the LPF 10a, the switch 12, and the duplexer 16 is referred to as an LB (Low Band) signal. A signal transmitted through the HPF 10b, the switch 14, and the duplexer 18 is referred to as an HB (High Band) signal.

The LB signal is input to the antenna 28 through the PA 24a, the transmit filter 16a, the switch 12, and the LPF 10a, and transmitted from the antenna 28. The LB signal received by the antenna 28 is input to the LNA 24b through the LPF 10a, the switch 12, and the receive filter 16b, and down-converted in the IC 24.

The HB signal is input to the antenna 28 through the HPF 10b, the PA 26, the transmit filter 18a, the switch 14, and the HPF 10b, and transmitted from the antenna 28. The HB signal received by the antenna 28 is input to the IC 24 through the HPF 10b, the switch 14, and the receive filter 18b, and down-converted.

Figure 2A:
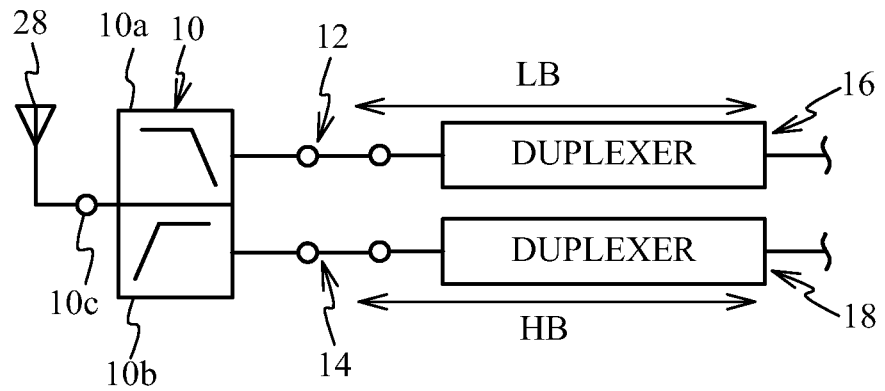
FIG. 2A through FIG. 2C are schematic views illustrating an operation of the module.
Figure 2B:
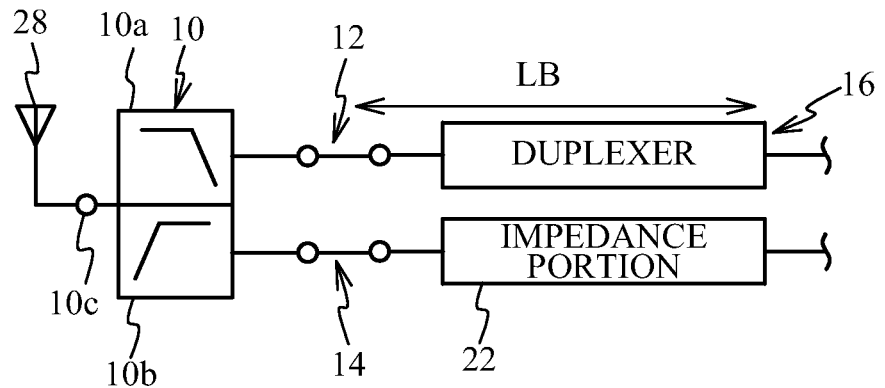
Figure 2C:
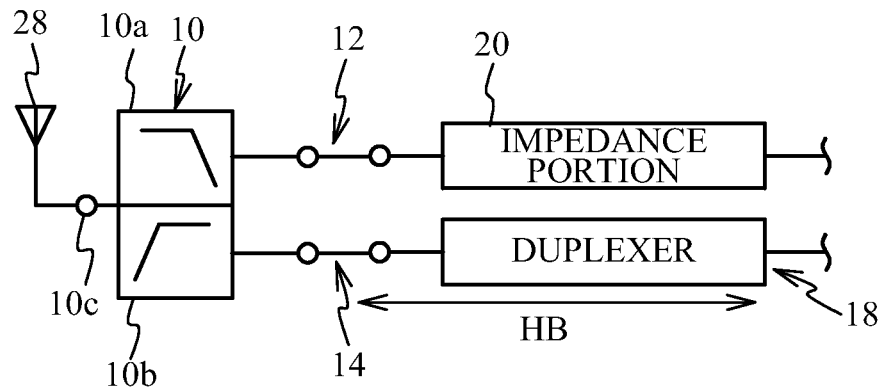

FIG. 2A through FIG. 2C are schematic views illustrating an operation of the module 100. FIG. 2A illustrates a case in which both the LB signal and the HB signal are simultaneously transmitted and received. The switch 12 selects the port 13 connected to the duplexer 16, and connects it to the diplexer 10. The switch 14 selects the port 15 connected to the duplexer 18, and connects it to the diplexer 10. Each of the impedance at the antenna 28 side, the impedance at the switch 12 side, and the impedance at the switch 14 side from the diplexer 10 is, for example, 50Ω. The impedance in the passband is matched between the antenna 28 and the duplexer 16 and between the antenna 28 and the duplexer 18.

FIG. 2B illustrates a case in which the LB signal out of the LB signal and the HB signal is transmitted and received and the HB signal is not transmitted or received. The switch 12 selects the port 13 connected to the duplexer 16. The switch 14 selects the port 15a connected to the impedance portion 22, and connects it to the diplexer 10. Thus, the impedance in the passband of the LPF 10a when the HPF 10b is viewed from the antenna terminal 10c of the diplexer 10 can be made to be high impedance, and the insertion loss of the LPF 10a can be therefore reduced.

FIG. 2C illustrates a case in which the HB signal is transmitted and received and the LB signal is not transmitted or received. The switch 12 selects the port 13a connected to the impedance portion 20, and connects it to the diplexer 10. The switch 14 selects the port 13 connected to the duplexer 16. Thus, the impedance in the passband of the HPF 10b when the LPF 10a is viewed from the antenna terminal 10c can be made to be high impedance, and the insertion loss of the HPF 10b can be therefore reduced. As illustrated in FIG. 2B and FIG. 2C, even in a case in which only one of the LB signal and the HB signal is transmitted and received, the impedance can be matched. As described later, when the impedance portions 20 and 22 include a reactance, the insertion loss can be further reduced.

Figure 3A:
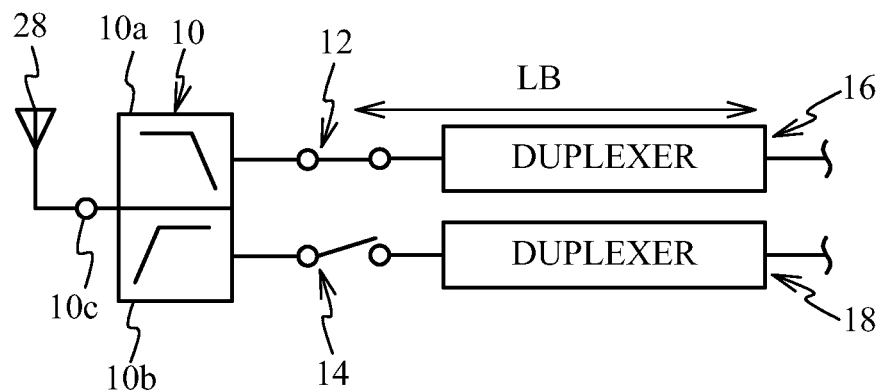
FIG. 3A and FIG. 3B are schematic views illustrating an operation of a module of a comparative example.
Figure 3B:
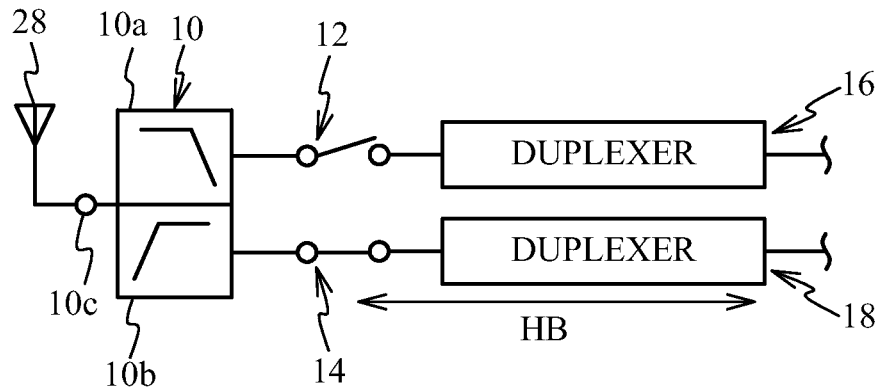

A description will be given of a comparative example. The comparative example does not provide the impedance portion 20 or 22. FIG. 3A and FIG. 3B are schematic views illustrating an operation of a module of the comparative example.

FIG. 3A illustrates a case in which the LB signal is transmitted and received and the HB signal is not transmitted or received. The switch 14 does not select any of the ports 15. Thus, the switch 14 is open or closed. The impedance at the switch 14 side from the diplexer 10 greatly deviates from the 50Ω. For example, when the switch 14 is open, the impedance approaches infinity. When the switch 14 is closed, the impedance is close to zero. FIG. 3B illustrates a case in which the HB signal is transmitted and received and the LB signal is not transmitted or received. The switch 12 does not select any of the ports 13. Thus, the impedance at the switch 12 side greatly deviates from the 50Ω.

As illustrated in FIG. 3A and FIG. 3B, in the comparative example, when only one of the LB signal and the HB signal is transmitted or received, it is difficult to match the impedance. In the case of FIG. 3A, the signal reflected at the switch 14 may leak to the switch 12 and the antenna 28. Thus, the insertion loss increases in the comparative example.

A description will be given of a simulation of frequency characteristics. In the simulation, the impedance portions 20 and 22 were assumed to be a π-type matching circuit. When the LB signal is transmitted and received, the matching circuit is connected to the switch 14 at the HB side. At this time, the impedance of the matching circuit as viewed from the antenna terminal 10c is configured to be high at the frequency of the LB signal. Therefore, the LB signal hardly leaks to the HPF 10b side. A signal of 915 MHz is included in the LB signal, and a signal of 1710 MHz is included in the HB signal.

Figure 4A:
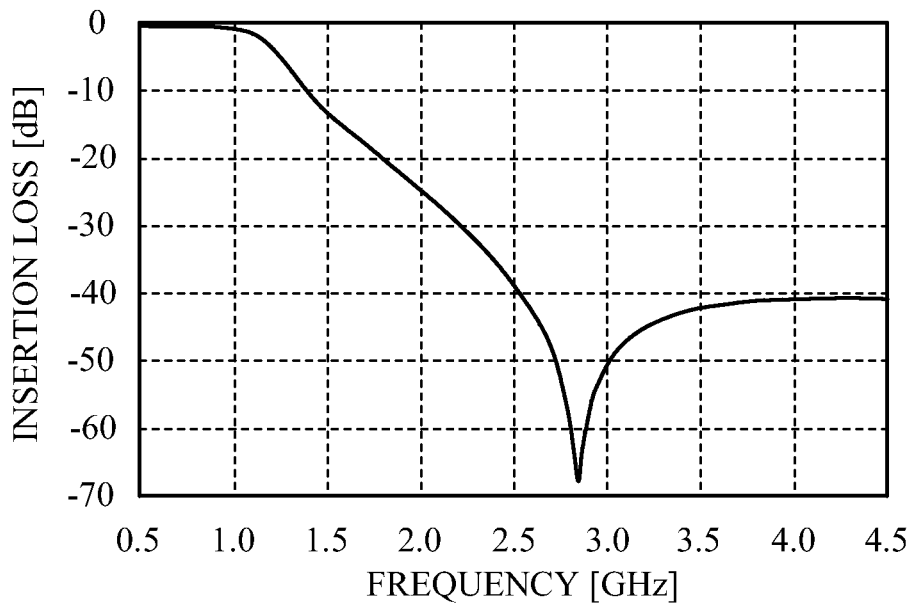
FIG. 4A and FIG. 4B are graphs illustrating frequency characteristics when an LB signal and an HB signal are simultaneously transmitted and received.
Figure 4B:
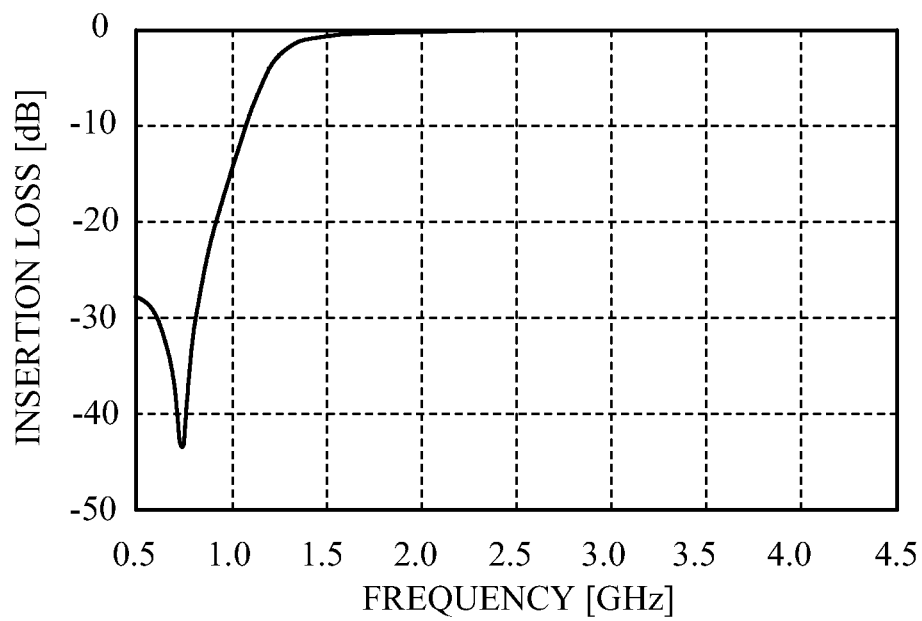
Figure 5A:
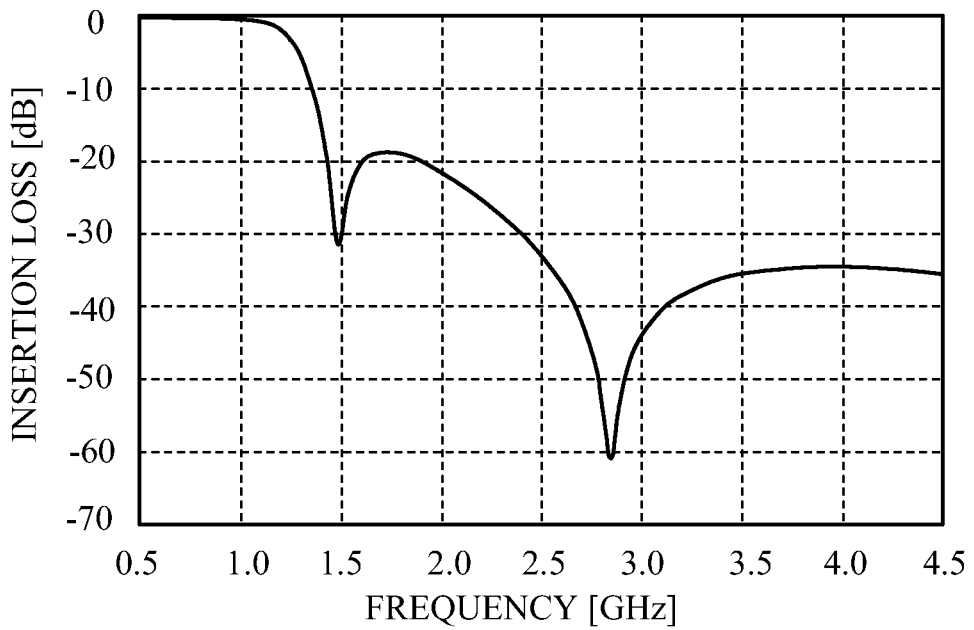
FIG. 5A and FIG. 5B are graphs illustrating frequency characteristics in the comparative example.
Figure 5B:
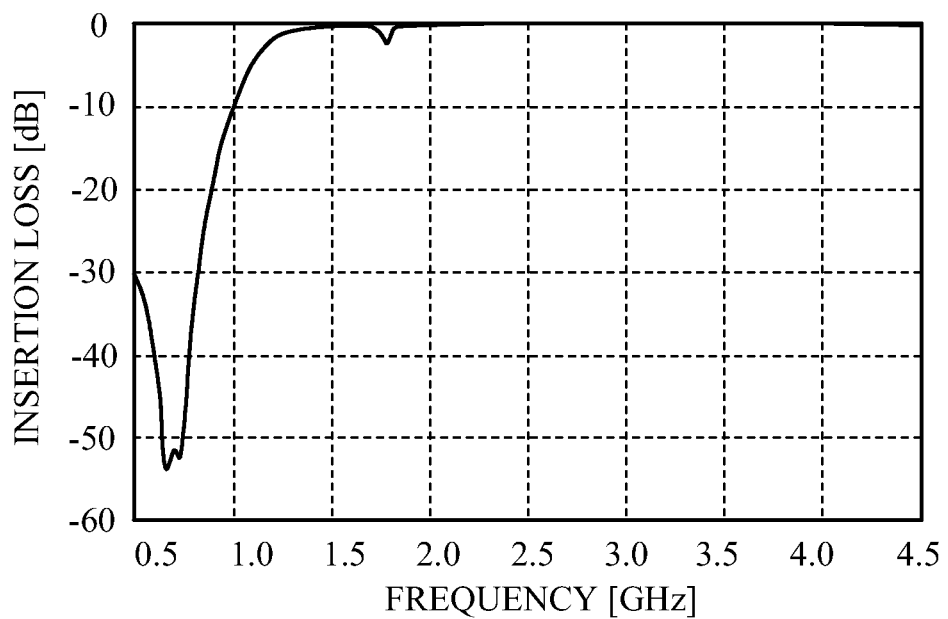
Figure 6A:
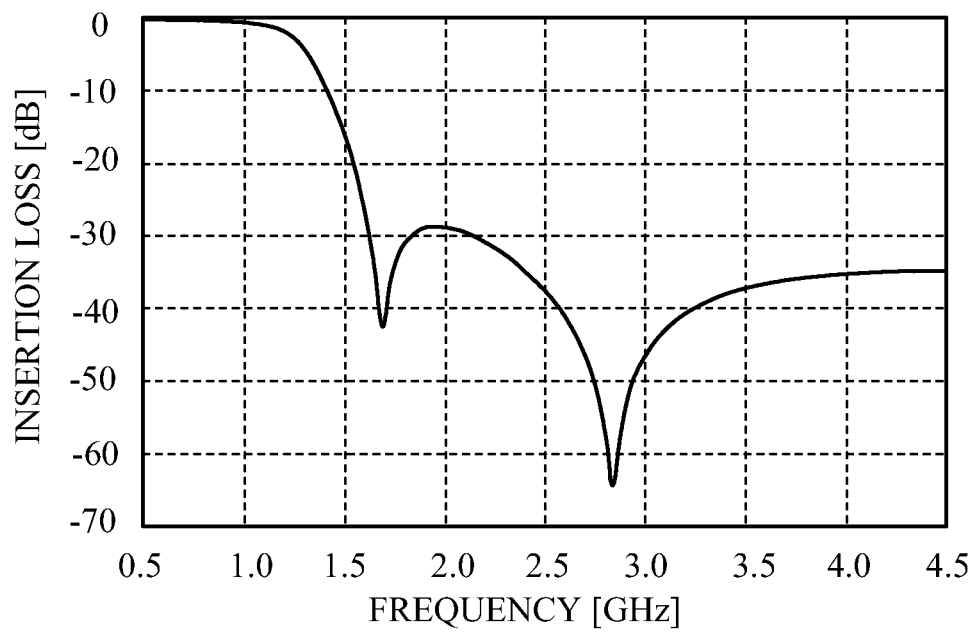
FIG. 6A and FIG. 6B are graphs illustrating frequency characteristics in the first embodiment.
Figure 6B:
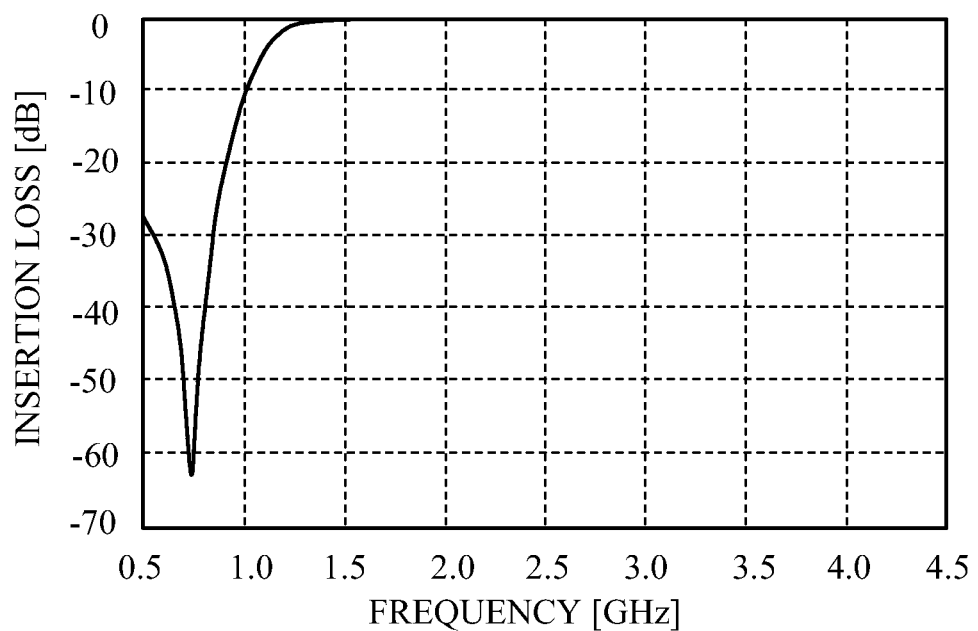

FIG. 4A and FIG. 4B are graphs illustrating frequency characteristics when both the LB signal and the HB signal are simultaneously transmitted and received (see FIG. 2A). FIG. 4A illustrates frequency characteristics of the duplexer 16, and FIG. 4B illustrates frequency characteristics of the duplexer 18. The horizontal axis represents a frequency, and the vertical axis represents insertion loss. FIG. 5A and FIG. 5B are graphs illustrating frequency characteristics in the comparative example. FIG. 5A illustrates frequency characteristics of the duplexer 16 when only the LB signal out of the LB signal and the HB signal is transmitted and received (see FIG. 3A). FIG. 5B illustrates frequency characteristics of the duplexer 18 when only the HB signal out of the LB signal and the HB signal is transmitted and received (see FIG. 3B). The switch 14 is open in FIG. 5A, and the switch 12 is open in FIG. 5B. FIG. 6A and FIG. 6B are graphs illustrating frequency characteristics in the first embodiment. FIG. 6A illustrates frequency characteristics of the duplexer 16 when only the LB signal is transmitted and received (see FIG. 2B). FIG. 6B illustrates frequency characteristics of the duplexer 18 when only the HB signal is transmitted and received (see FIG. 2C). Table 1 lists insertion loss at 915 MHz and 1710 MHz.

TABLE 1

|  | Signal | Frequency [MHz] | Insertion loss [dB] |
|---|---|---|---|
| Simultaneous transmission and reception | LB signal | 915 | −0.561 |
|  |  | 1710 | −17.974 |
|  | HB signal | 915 | −20.255 |
|  |  | 1710 | −0.32 |
| Comparative example | LB signal | 915 | −0.514 |
|  |  | 1710 | −18.9 |
|  | HB signal | 915 | −17.908 |
|  |  | 1710 | −0.395 |
| First embodiment | LB signal | 915 | −0.509 |
|  |  | 1710 | −42.178 |
|  | HB signal | 915 | −21.075 |
|  |  | 1710 | −0.234 |

As presented in FIG. 4A through FIG. 6B and Table 1, in both the LB signal and the HB signal, the first embodiment exhibits good frequency characteristics compared to the simultaneous transmission and reception and the comparative example. That is to say, the insertion loss in the passband is reduced, and the degree of suppression in the suppression band increases. In addition, a steep attenuation pole is formed in the suppression band. This is because the first embodiment can match the impedance as described above. In addition, the impedance portion includes a reactance, and thereby the duplexers 16 and 18 can be optimized. A detailed description will be given of this point.

The duplexers 16 and 18 are simultaneously adjusted in the simultaneous transmission and reception. That is to say, the duplexer 16 is adjusted to pass the LB signal and suppress the HB signal while the duplexer 18 is adjusted to pass the HB signal and suppress the LB signal. The duplexers 16 and 18 affect each other. For example, when the duplexer 16 is optimized, the frequency characteristics of the duplexer 18 deteriorate. As described above, there is a trade-off relationship between the duplexers.

In the first embodiment, when only the LB signal is transmitted and received, the impedance portion 22 that optimizes only the duplexer 16 can be used. When only the HB signal is transmitted and received, the impedance portion 20 that optimizes only the duplexer 18 can be used. This improves frequency characteristics in both the duplexers 16 and 18.

As presented in FIG. 4A, FIG. 5A, and Table 1, regarding the LB signal, the comparative example exhibits good frequency characteristics compared to the simultaneous transmission and reception. As presented in FIG. 4B, FIG. 5B, and Table 1, regarding the HB signal, the simultaneous transmission and reception exhibits good frequency characteristics compared to the comparative example. This is because the effect of the switches 12 and 14 depends on the length of the wiring. Although the illustration is omitted, when the switch 14 is closed in the comparative example, the insertion loss of the duplexer 16 is −0.535 dB at 915 MHz.

When the switch 12 is closed, the insertion loss of the duplexer 18 is −0.258 dB at 1710 MHz. Compared to the cases in which the switches are closed, the first embodiment exhibits good frequency characteristics.

Figure 7A:
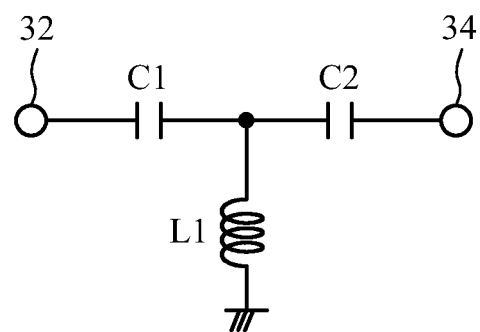
FIG. 7A and FIG. 7B are circuit diagrams illustrating examples of an impedance portion.
Figure 7B:
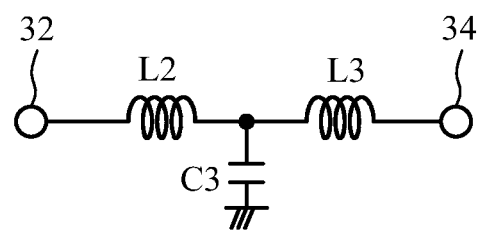

A description will be given of examples of the impedance portion. To improve the insertion loss, the impedance portion preferably includes a reactance. FIG. 7A and FIG. 7B are circuit diagrams illustrating examples of the impedance portion.

As illustrated in FIG. 7A, the impedance portion is a π-type LC circuit 30, and includes an inductor L1, and capacitors C1 and C2. The capacitors C1 and C2 are connected in series between a terminal 32 and a terminal 34. A first end of the inductor L1 is connected between the capacitor C1 and the capacitor C2, and a second end thereof is grounded. The terminal 32 is coupled to the port 13a or 15a, and the terminal 34 is opened. As illustrated in FIG. 7B, the impedance portion may be a T-type LC circuit 36. Inductors L2 and L3 are connected in series between the terminal 32 and the terminal 34. A first end of a capacitor C3 is connected between the inductor L2 and the inductor L3, and a second end thereof is grounded. The impedance portion may be a circuit other than the aforementioned circuits, and may be a circuit including at least one of a capacitor and an inductor. The impedance portions 20 and 22 may be different circuits. The impedance portion may be an electric resistance of 50Ω.

The switches 12 and 14 are FET switches using an FET for switching. Signals easily leak through the FET switch. The first embodiment can also reduce the leakage of the signal in the FET switch. The number of duplexers may be changed as long as at least one duplexer is coupled to the switch. A duplexer may be coupled to one of the terminals 10d and 10e of the diplexer 10 without the switch, and the switch may be coupled to the other one. That is to say, it is sufficient if at least one switch is included. An acoustic wave filter such as a SAW filter, a boundary acoustic wave filter, or a Film Bulk Acoustic Resonator (FBAR) filter may be used as a filter included in the duplexer.

Although the embodiments of the present invention have been described in detail, it is to be understood that the various change, substitutions, and alterations could be made hereto without departing from the spirit and scope of the invention.

What is claimed is:

1. A module comprising:
    a diplexer that includes a first terminal, a second terminal, and a common terminal coupled to an antenna;
    a first switch that is coupled to the first terminal, includes first ports, and selects, from the first ports, and connects one port to the diplexer;
    a first duplexer that is coupled to at least one of the first ports;
    a second duplexer that is coupled to the second terminal and has a passband different from a passband of the first duplexer; and
    a first impedance portion that is coupled to another port of the first ports,
    wherein the another port of the first ports is not coupled to a filter or a duplexer through the first impedance portion.

2. The module according to claim 1, wherein
    the first switch includes an FET.

3. The module according to claim 1, wherein
    the first impedance portion includes a reactance.

4. The module according to claim 3, wherein
    the first impedance portion includes at least one of an inductor and a capacitor.

5. A module comprising:
    a diplexer that includes a first terminal, a second terminal, and a common terminal coupled to an antenna;
    a first switch that is coupled to the first terminal, includes first ports, and selects, from the first ports, and connects one port to the diplexer;
    a first duplexer that is coupled to at least one of the first ports;
    a second duplexer that is coupled to the second terminal and has a passband different from a passband of the first duplexer;
    a first impedance portion that is coupled to another port of the first ports;
    a second switch that is coupled to the second terminal, includes second ports, and selects, from the second ports, and connects one port to the diplexer; and
    a second impedance portion,
    wherein the second duplexer is coupled to the second terminal through at least one of the second ports, and
    the second impedance portion is coupled to another port of the second ports.

6. The module according to claim 5, wherein
    the first switch selects a first port connected to the first duplexer from the first ports while the second switch selects a second port connected to the second duplexer from the second ports.

7. The module according to claim 5, wherein
    the second impedance portion includes a reactance.

8. The module according to claim 7, wherein
    the second impedance portion includes at least one of an inductor and a capacitor.

9. The module according to claim 5, wherein
the first switch selects a first port connected to the first impedance portion from the first ports when the second switch selects a second port connected to the second duplexer from the second ports.

10. The module according to claim 5, wherein
the second switch includes an FET.

11. The module according to claim 2, wherein
the first switch selects a first port connected to the first duplexer from the first ports and the second switch selects a second port connected to the second duplexer from the second ports when a first signal passing through the first switch and a second signal passing through the second switch are simultaneously transmitted or received, the first switch selects a third port connected to the first impedance portion from the first ports and the second switch selects the second port connected to the second duplexer from the second ports when the first signal is not transmitted or received and the second signal is transmitted or received.

* * * * *